United States Patent
Hayashi

(10) Patent No.: US 8,725,308 B2
(45) Date of Patent: May 13, 2014

(54) RACK MOUNTING POSITION MANAGEMENT SYSTEM AND RACK MOUNTING POSITION MANAGEMENT METHOD

(75) Inventor: Toshiyuki Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 256 days.

(21) Appl. No.: 13/024,895

(22) Filed: Feb. 10, 2011

(65) Prior Publication Data

US 2011/0202172 A1 Aug. 18, 2011

(30) Foreign Application Priority Data

Feb. 15, 2010 (JP) .................................. 2010-029690

(51) Int. Cl.
*B05D 1/10* (2006.01)

(52) U.S. Cl.
USPC .......................................... 700/302; 700/214

(58) Field of Classification Search
USPC .................. 709/217; 700/302, 214, 228, 229; 702/150, FOR. 141; 235/375
See application file for complete search history.

(56) References Cited

U.S. PATENT DOCUMENTS

| 2003/0046339 A1* | 3/2003 | Ip ................................... 709/203 |
| 2008/0099557 A1* | 5/2008 | James ........................... 235/385 |
| 2011/0210167 A1* | 9/2011 | Lyon .............................. 235/375 |

FOREIGN PATENT DOCUMENTS

| JP | H8-235730 A | 9/1996 |
| JP | H10-69689 A | 3/1998 |
| JP | 2008003917 A | 1/2008 |
| JP | 2011-510402 A | 3/2011 |
| WO | 2009/091888 A1 | 7/2009 |

OTHER PUBLICATIONS

Japanese Office Action for JP Application No. 2010-029690 mailed on Nov. 5, 2013 with English Translation.

* cited by examiner

*Primary Examiner* — Ramya Burgess
*Assistant Examiner* — Lester Rushin
(74) *Attorney, Agent, or Firm* — Sughrue Mion, PLLC

(57) ABSTRACT

An exemplary aspect of the invention is a rack mounting position management system including a rack having a plurality of units, and a mounted device mounted in the rack. The rack includes, for each of the units, a signal output unit that outputs a signal having a different value for each of the units of the rack. The mounted device includes a signal acquisition unit that acquires the signal output from the signal output unit, and a control unit that discriminates a mounting position of the mounted device in the rack according to a value of the signal acquired by the signal acquisition unit.

4 Claims, 6 Drawing Sheets

RACK MOUNTING POSITION MANAGEMENT SYSTEM AND RACK MOUNTING POSITION MANAGEMENT METHOD

INCORPORATION BY REFERENCE

This application is based upon and claims the benefit of priority from Japanese patent application No. 2010-029690, filed on Feb. 15, 2010, the disclosure of which is incorporated herein in its entirety by reference.

BACKGROUND OF THE INVENTION

1. Field of the Invention

The present invention relates to a rack mounting position management system and a rack mounting position management method.

2. Description of Related Art

In recent years, rack mount systems for mounting electronic devices, such as servers, in a rack have been in widespread use. In the case of using such a rack mount system, it is necessary to manage the mounting positions of electronic devices mounted in a rack. Up to now, the mounting positions of electronic devices are managed by a system administrator such that IDs are allocated to the respective electronic devices and a database in which the IDs are associated with the mounting positions is created. In this method, once the database is created, the mounting positions of the electronic devices can be easily recognized thereafter. However, if the number of electronic devices to be mounted in the rack is large, a huge amount of time and labor is required for the system administrator to create the database.

For example, Japanese Unexamined Patent Publication No. 2008-003917 discloses a rack mount system which includes a rack-side I/F connection unit that transmits a unit ID indicating a mounting position to each unit of a rack, and a mounted device side I/F connection unit that receives the unit ID transmitted from the rack-side I/F connection unit to a mounted device which is mounted in the rack. In the rack mount system, the mounted device transmits the ID of the mounted device and the received unit ID to a management server, and a table for associating the ID of the mounted device with the received unit ID is created in the management server. The mounted device and the mounting position thereof can be easily managed by referring to the table.

In Japanese Unexamined Patent Publication No. 2008-003917, however, the unit ID is 6-bit data, and each mounted device transmits the unit ID to the management server. Accordingly, it is necessary for the management server to calculate an actual mounting position (physical mounting position) from the unit ID. Furthermore, in order to calculate the actual mounting position, it is necessary for the system administrator to create a table showing 6-bit data of each unit ID indicating a stage of each unit. In other words, in the rack mount system disclosed in Japanese Unexamined Patent Publication No. 2008-003917, it is necessary for the system administrator to create a table for associating a unit ID with mounting position information indicating an actual mounting position. Therefore, if the number of mounted devices is large, a considerable amount of time and labor is required for the system administrator to create the table.

SUMMARY

An exemplary object of the present invention is to provide a rack mounting position management system and a rack mounting position management method that can reliably reduce the time and labor of a system administrator and facilitate management of mounting positions of mounted devices.

A first exemplary aspect of the invention is a rack mounting position management system including a rack having a plurality of units, and a mounted device mounted in the rack. The rack includes, for each of the units, a signal output unit that outputs a signal having a different value for each of the units of the rack. The mounted device includes a signal acquisition unit and a discrimination unit. The signal acquisition unit acquires the signal output from the signal output unit. The discrimination unit discriminates a mounting position of the mounted device in the rack according to a value of the signal acquired by the signal acquisition unit.

A second exemplary aspect of the invention is a rack mounting position management method for a rack mounting position management system which includes a rack having a plurality of units, and a mounted device mounted in the rack. The rack includes, for each of the units, a signal output unit that outputs a signal having a different value for each of the units of the rack. The mounted device includes a signal acquisition unit that acquires the signal output from the signal output unit. The mounted device executes discrimination processing for discriminating a mounting position of the mounted device in the rack according to a value of the signal acquired by the signal acquisition unit.

BRIEF DESCRIPTION OF THE DRAWINGS

The above and other aspects, features, and advantages of the present invention will become more apparent from the following description of certain exemplary embodiments when taken in conjunction with the accompanying drawings, in which.

EXEMPLARY EMBODIMENTS

Figure 1:
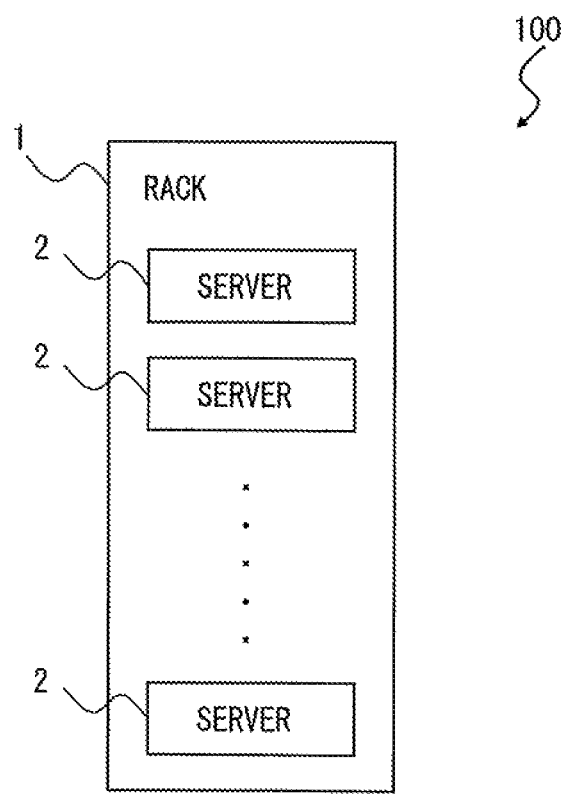
FIG. 1 is a block diagram showing an example of a rack mounting position management system according to the present invention.

Firstly, an outline of a rack mounting position management system 100 and a rack mounting position management method according to an exemplary embodiment of the present invention will be described. Referring to FIG. 1, the rack mounting position management system 100 according to this exemplary embodiment includes a rack 1 having a plurality of units, servers 2 which are mounted devices mounted in the rack 1, and the like.

The rack 1 includes, for each of the units, a signal output unit that outputs a signal having a difference value for each of the units of the rack 1.

Each of the servers 2, which are housed in the respective units, includes a signal acquisition unit that acquires the signal output from the signal output unit of the corresponding unit in which the server 2 is housed.

Each of the servers 2 discriminates the unit, in which the server 2 is housed, according to a value of the signal acquired by the signal acquisition unit. In other words, each of the servers 2 discriminates the mounting position of the server 2 in the rack 1 according to the value of the signal acquired by the signal acquisition unit.

In the present invention, each of the servers 2 discriminates the mounting position of the server 2 in the rack 1 according to the value of the signal output from the signal output unit of the rack 1. This eliminates the need for a system administrator to create a table showing the value of the signal from the signal output unit and the stage of the unit of the rack 1 indicated by the value of the signal. Therefore, the time and labor of the system administrator can be reliably reduced. Furthermore, the mounting position of the server 2 can be referred to via a network in the management device by connecting the servers 2 to the management device via the network. This facilitates management of the mounting positions of the servers 2.

Exemplary embodiments of the present invention will be described below. The present invention is not limited to the exemplary embodiments described below.

First Exemplary Embodiment

Figure 2:
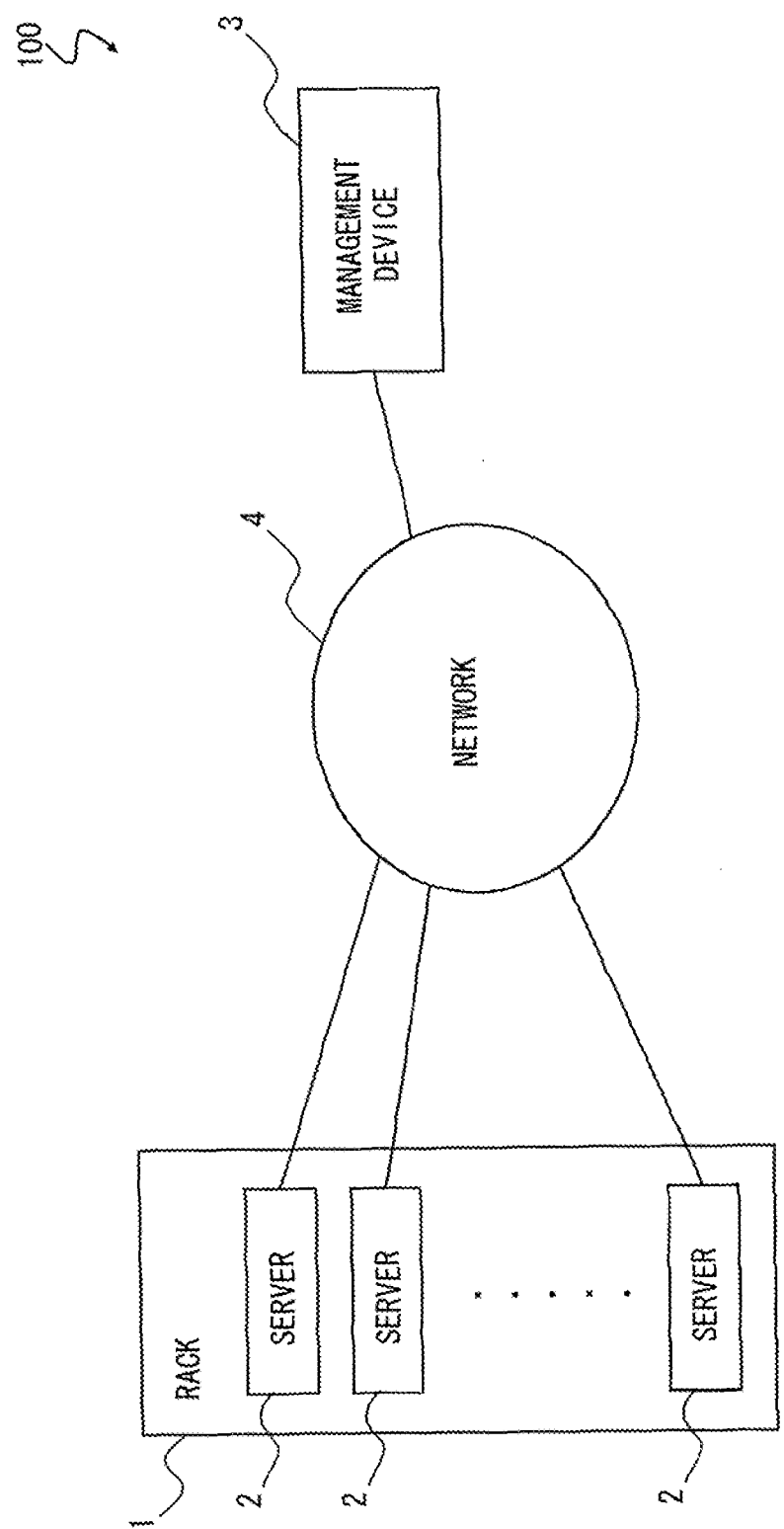
FIG. 2 is a block diagram showing an example of the rack mounting position management system according to the first exemplary embodiment of the present invention.

FIG. 2 is a block diagram showing an exemplary configuration of the rack mounting position management system 100 according to a first exemplary embodiment of the present invention. As shown in FIG. 2, the rack mounting position management system 100 includes the rack 1, the servers 2 (mounted devices), a management device 3, and a network 4.

The servers 2 are housed in the respective units of the rack 1. Further, the servers 2 are communicably connected to the management device 1 via the network 4.

Figure 3:
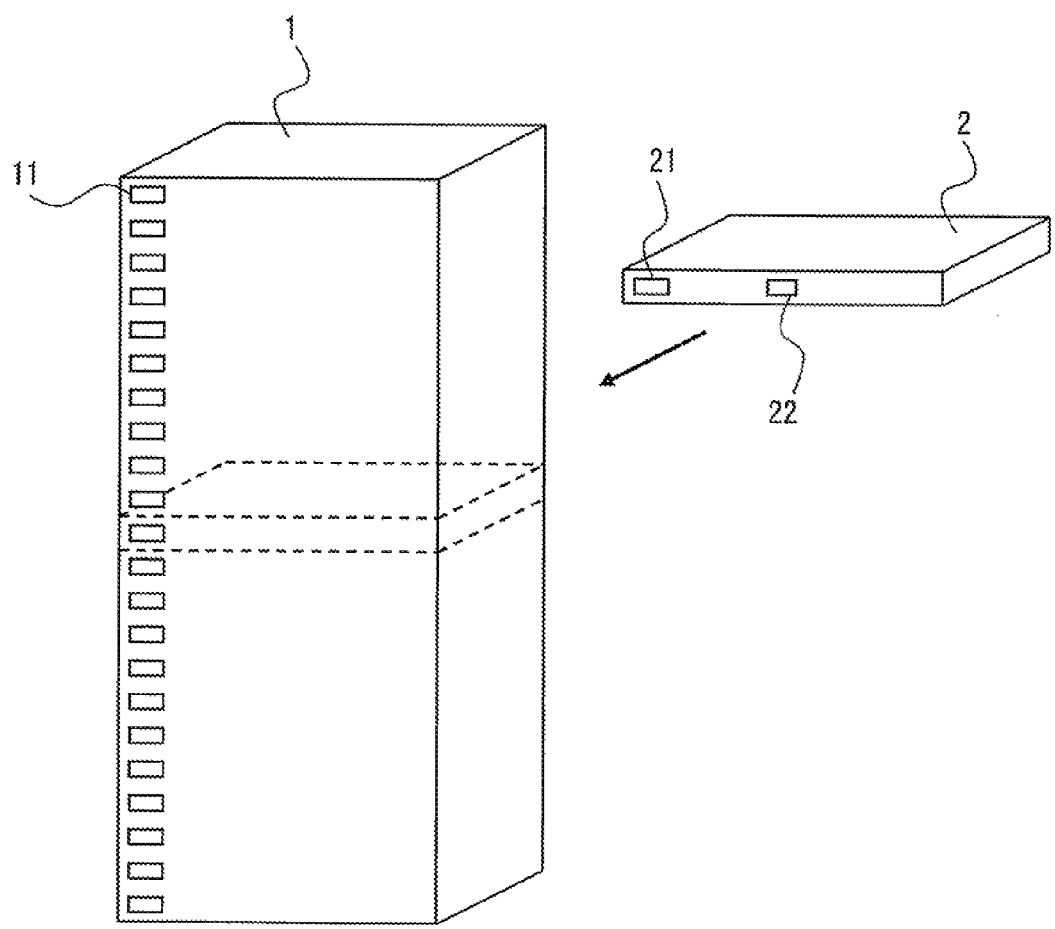
FIG. 3 is a perspective view schematically showing a rack and a server according to the first exemplary embodiment of the present invention.

FIG. 3 is a perspective view schematically showing the rack 1 and the server 2 according to the first exemplary embodiment. As shown in FIG. 3, signal output units 11 are each provided on the back surface side of the corresponding unit of the rack 1. The signal output units 11 output signals having different values.

Additionally, on the back surface side of each of the servers 2, which comes into contact with the back surface of the corresponding unit of the rack 1, a signal acquisition unit 21 is provided. More specifically, the signal acquisition unit 21 is provided to each of the servers 2 at a position corresponding to the position of the signal output unit 11 of the rack 1. In other words, when the server 2 is housed in the corresponding unit of the rack 1, the signal output unit 11 and the signal acquisition unit 21 can be brought into contact with each other.

The positions of the signal output unit 11 and the signal acquisition unit 21 are not limited to those shown in FIG. 3, but may be arbitrarily determined as long as the signal output unit 11 and the signal acquisition unit 21 can be brought into contact with each other when the server 2 is housed in the corresponding unit of the rack 1.

Furthermore, a LAN (Local Area Network) port 22 (communication unit) is provided on the back surface side of each of the servers 2. Note that the position where the LAN port 22 is provided is not limited to that shown in FIG. 3.

Figure 4:
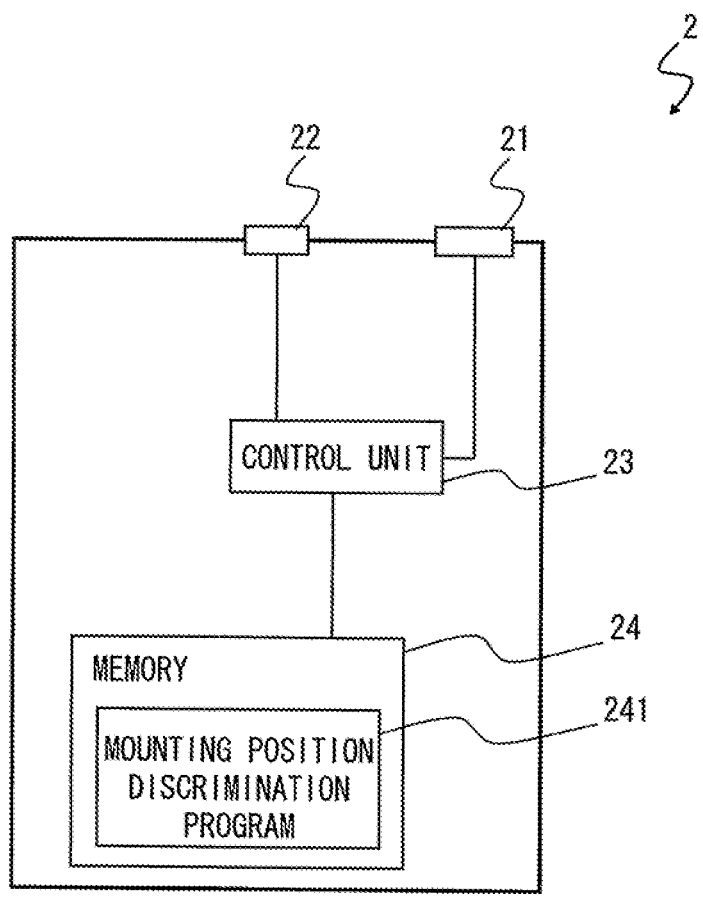
FIG. 4 is a plan view schematically showing the server according to the first exemplary embodiment of the present invention.

FIG. 4 is a plan view schematically showing the server 2 according to the first exemplary embodiment. As shown in FIG. 4, the server 2 includes a control unit 23 and a memory 24 (memory unit) as well as the signal acquisition unit 21 and the LAN port 22 (communication unit). The memory 24 stores various programs for controlling each unit of the server 2, for example. The control unit 23 controls each unit of the server 2 by executing the various programs stored in the memory 24, for example. For instance, the control unit 23 functions as discrimination means by executing a mounting position discrimination program 241.

The control unit 23 is composed of a BMC (Baseboard Management Controller), for example.

The mounting position discrimination program 241 is executed by the control unit 23 so as to generate mounting position information indicating an actual mounting position (physical mounting position) of each server 2 based on the value of the signal acquired by the signal acquisition unit 21. The control unit 23 stores the mounting position information, which is generated by executing the mounting position discrimination program 241, in the memory 24.

When the control unit 23 executes the mounting position discrimination program 241 to generate the mounting position information indicating the actual mounting position of each server 2 based on the value of the signal acquired by the signal acquisition unit 21, the control unit 23 generates the mounting position information without referring to a table or the like in which the value of the signal is associated with the mounting position information. That is, in the rack mounting position management system 100 and the rack mounting position management method according to this exemplary embodiment of the present invention, it is not necessary for the system administrator to create a table showing the value of the signal from the signal output unit 11 and the stage of the unit of the rack indicated by the value of the signal.

For instance, the signal output units 11 of the rack 1 output signals having different voltage values. The mounting position discrimination program 241 is an algorithm for the control unit 23 to discriminate the mounting position of each of the servers 2 according to a difference between voltage values of the signals acquired by the signal acquisition unit 21. Table 1 shows the actual mounting position of each of the servers 2, the voltage value of the signal output from each of the signal output units 11 of the rack 1, and the mounting position information generated by the control unit 23, which are associated with each other. As shown in Table 1, the mounting position discrimination program 241 is an algorithm for the control unit 23 to generate certain mounting position information for a certain voltage value. Accordingly, in the rack mounting position management system 100 and the rack mounting position management method according to this exemplary embodiment of the present invention, there is no need to create a table for associating the value of the signal acquired by each of the signal acquisition units 21 with the mounting position information indicating the actual mounting position of each of the servers 2.

TABLE 1

| Actual Mounting Position | Voltage of Signals output from Signal Output Units | Mounting Position Information |
|---|---|---|
| First stage | 1.1 V | First stage |
| Second stage | 1.2 V | Second stage |
| Third stage | 1.3 V | Third stage |
| . | . | . |
| . | . | . |
| . | . | . |

The memory 24 stores the mounting position information, which is generated by executing the mounting position discrimination program 241 by the control unit 23, for example, as well as various programs for controlling each unit of the server 2. The memory 24 also stores identification information on each server 2. The identification information on each server 2 indicates a product number of each server 2, for example.

The LAN port 22 communicably connects each server 2 to the network 4. In other words, the LAN port 22 communicably connects each server 2 to the management device 3 via the network 4. When the LAN port 22 receives a mounting position information notification command from the management device 3 via the network 4, the control unit 23 controls the LAN port 22 and transmits the mounting position information and the identification information on the server 2, which are stored in the memory 24, to the management device 3.

The management device 3 includes a control unit (not shown), a memory (not shown), and a communication unit (not shown). The memory stores various programs for controlling each unit of the management device 3, for example. The control unit executes various programs or the like stored in the memory, thereby controlling each unit of the management device 3. For instance, the control unit controls the communication unit to transmit the mounting position information notification command to each server 2.

Figure 5:
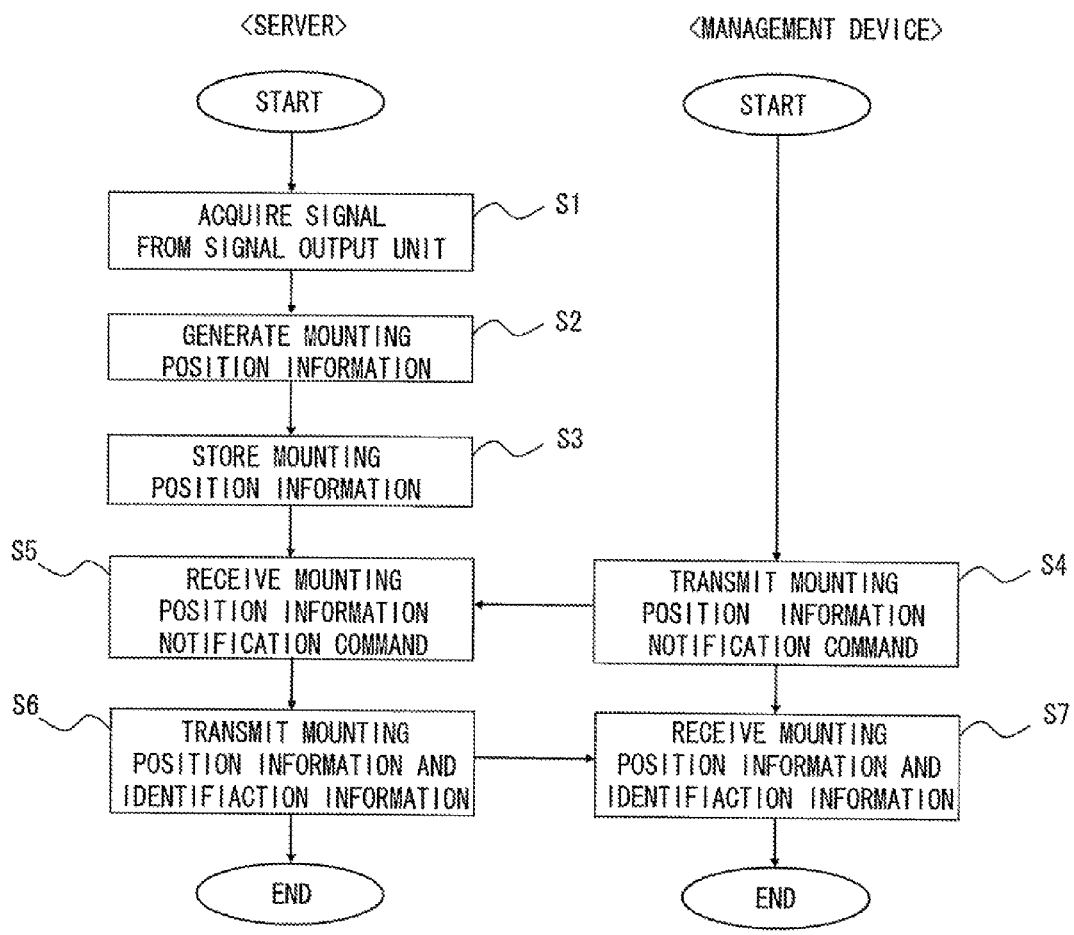
FIG. 5 is a flowchart illustrating a rack mounting position management method according to the first exemplary embodiment of the present invention.

Referring next to the flowchart shown in FIG. 5, an exemplary rack mounting position management method for the rack mounting position management system 100 according to the first exemplary embodiment will be described.

Firstly, in the server 2, the signal acquisition unit 21 acquires the signal output from the corresponding signal output unit 11 of the rack 1 (step S1).

Next, the control unit 23 of the server 2 executes the mounting position discrimination program 241 to generate the mounting position information according to the value of the signal acquired in step S1 (step S2). Subsequently, the control unit 23 stores the mounting position information generated in step S2 in the memory 24 (step S3).

Then, the management device 3 transmits the mounting position information notification command to the server 2 (step S4).

When the server 2 receives the mounting position information notification command (step S5), the control unit 23 controls the LAN port 22 to enable to transmit the mounting position information and the identification information which are stored in the memory 24 to the management device 3 (step S6).

Then, the management device 3 receives the mounting position information and the identification information from the server 2 (step S7).

According to the rack mounting position management system 100 and the rack mounting position management method of the first exemplary embodiment described above, each server 2 discriminates the mounting position of the server 2 in the rack 1 according to the value of the signal output from the corresponding signal output unit 11 of the rack 1. This eliminates the need for the system administrator to create a table showing the values of the signals from the signal output units 11 and the stages of the units of the rack 1 indicated by the values. Therefore, the time and labor of the system administrator can be reliably reduced. Furthermore, in the management device 3, the mounting position of each server 2 can be referred to via the network by connecting each server 2 to the management device 3 via the network 4. This facilitates management of the mounting positions of the servers 2.

Second Exemplary Embodiment

Figure 6:
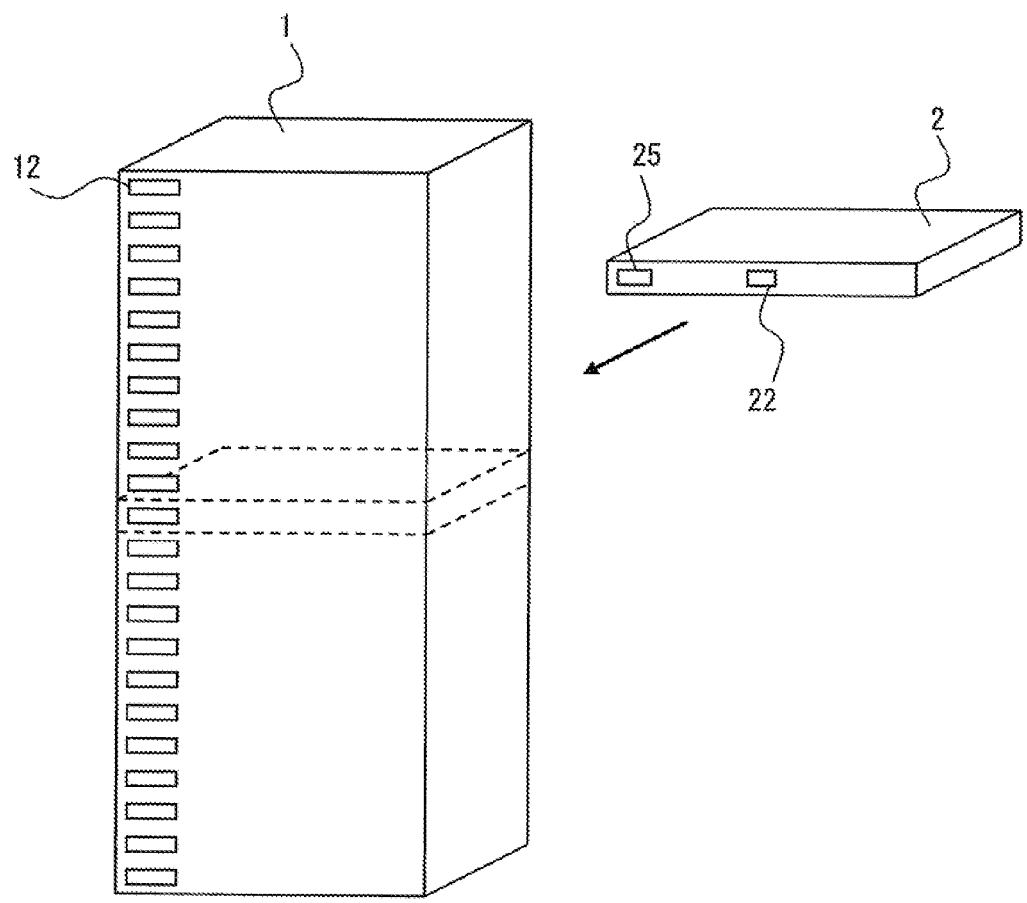
FIG. 6 is a perspective view schematically showing a rack and a server according to a second exemplary embodiment of the present invention.

FIG. 6 is a perspective view schematically showing a rack and a server according to a second exemplary embodiment of the present invention. Referring to FIG. 6, a rack mounting position management system of the second exemplary embodiment differs from the rack mounting position management system 100 of the first exemplary embodiment in that the rack mounting position management system of the second exemplary embodiment includes a barcode label 12 as a signal output unit, and a barcode reader 25 as a signal acquisition unit. Accordingly, the same components are denoted by the same reference numerals, and the description thereof is omitted.

The barcode label 12 is attached to the back surface side of the corresponding unit of the rack 1. Each of the barcode labels 12 displays a signal having a different value.

The barcode reader 25 is provided on the back surface side of each server 2 which comes into contact with the back surface of the corresponding unit of the rack 1. More specifically, the barcode reader 25 is provided at a position corresponding to the barcode label 12 in the corresponding server 2 of the rack 1. In other words, when the server 2 is housed in the corresponding unit of the rack 1, the barcode label 12 and the barcode reader 25 can be brought into contact with each other.

Note that the positions of the barcode label 12 and the barcode reader 25 are not limited to those shown in FIG. 6, but may be arbitrarily determined as long as the barcode label 12 and the barcode reader 25 can be brought into contact with each other when the server 2 is housed in the corresponding unit of the rack 1.

The barcode reader 25 reads the signal displayed on the corresponding barcode 12. The control unit 23 executes the mounting position discrimination program 241, thereby generating mounting position information indicating an actual mounting position (physical mounting position) of each server 2 based on the value of the signal read by the barcode reader 25. The control unit 23 stores the mounting position information, which is generated by executing the mounting position discrimination program 241, in the memory 24.

Also in the rack mounting position management system and the rack mounting position management method of the second exemplary embodiment, the mounting position discrimination program 241 is an algorithm for the control unit 23 to generate certain mounting position information for a certain value of the signal read by the barcode reader 25. Therefore, also in the rack mounting position management system and the rack mounting position management method of the second exemplary embodiment, there is no need to create a table for associating the value of the signal acquired by the barcode reader 25 with the mounting position information indicating the actual position of each server 2.

According to the rack mounting position management system and the rack mounting position management method of the second exemplary embodiment, the same effects as those of the first exemplary embodiment can be obtained. Furthermore, there is no need to provide the signal output units 11 to the rack 1, and it is only necessary to attach the barcode label 12 to an existing rack. Therefore, a rack mounting position management system can be relatively easily constructed using an existing rack.

The present invention is not limited to the above exemplary embodiments, but can be modified in various manners without departing from the scope of the present invention. For instance, a QR code (two-dimensional barcode) may be used in place of the barcode 12. Moreover, the value of the signal output from the signal output unit 11, or the value of the signal displayed on the barcode 12 may include identification information on the rack 1.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

Each of the above-described embodiments can be combined as desirable by one of ordinary skill in the art.

An exemplary advantage according to the above-described embodiments is that the time and labor of a system administrator can be reliably reduced and management of mounting positions of mounted devices can be facilitated.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The whole or part of the exemplary embodiments disclosed above can be described as, but not limited to, the following supplementary notes.

(Supplementary Note 1)

A rack mounting position management system comprising:
 a rack having a plurality of units; and
 a mounted device mounted in the rack, wherein
 the rack comprises, for each of the units, a signal output unit that outputs a signal having a different value for each of the units of the rack, and
 the mounted device comprises:
 a signal acquisition unit that acquires the signal output from the signal output unit; and
 a control unit that discriminates a mounting position of the mounted device in the rack according to a value of the signal acquired by the signal acquisition unit.

(Supplementary Note 2)

The rack mounting position management system according to Supplementary note 1, wherein the mounted device further comprises a memory unit that stores mounting position information indicating the mounting position discriminated by the control unit.

(Supplementary Note 3)

The rack mounting position management system according to Supplementary note 2, wherein
 the mounted device further comprises a communication unit that communicates with an outside, and
 the communication unit transmits the mounting position information and identification information on the mounted device stored in the memory unit to the outside.

(Supplementary Note 4)

The rack mounting position management system according to Supplementary note 3, further comprising a management device that is communicably connected to the mounted device,
 wherein the communication unit transmits the mounting position information and the identification information on the mounted device to the management device.

(Supplementary Note 5)

The rack mounting position management system according to any one of Supplementary notes 1 to 4, wherein
 the signal output unit is a barcode that displays a signal having a different value for each of the units of the rack, and
 the signal acquisition unit is a barcode reader that reads the signal displayed on the barcode.

(Supplementary Note 6)

A rack mounting position management method for a rack mounting position management system,
 the rack mounting position management system comprising:
 a rack having a plurality of units; and
 a mounted device mounted in the rack, wherein
 the rack comprises, for each of the units, a signal output unit that outputs a signal having a different value for each of the units of the rack,
 the mounted device comprises a signal acquisition unit that acquires the signal output from the signal output unit, and
 the mounted device executes discrimination processing for discriminating a mounting position of the mounted device in the rack according to a value of the signal acquired by the signal acquisition unit.

(Supplementary Note 7)

The rack mounting position management method according to Supplementary note 6, wherein the mounted device executes storage processing for causing the memory unit to store mounting position information indicating the mounting position discriminated in the discrimination processing.

(Supplementary Note 8)

The rack mounting position management method according to Supplementary note 7, wherein
 the mounted device further comprises a communication unit that communicates with an outside, and
 the communication unit transmits the mounting position information and identification information on the mounted device stored in the memory unit to the outside.

(Supplementary Note 9)

The rack mounting position management method according to Supplementary note 8, wherein
 the rack mounting position management system further comprises a management device that is communicably connected to the mounted device, and
 the communication unit transmits the mounting position information and the identification information on the mounted device to the management device.

(Supplementary Note 10)

The rack mounting position management method according to any one of Supplementary notes 6 to 9, wherein
 the signal output unit is a barcode that displays a signal having a different value for each of the units of the rack, and
 the signal acquisition unit is a barcode reader that reads the signal displayed on the barcode.

What is claimed is:

1. A rack mounting position management system comprising:
 a rack having a plurality of units; and
 a mounted device mounted in the rack, wherein the rack comprises, for each of the units, a signal output unit that outputs a signal having a different value for each of the units of the rack, and the mounted device comprises:

a signal acquisition unit that acquires the signal output from the signal output unit;

a control unit that generates, by using a program, mounting position information indicating a mounting position of the mounted device in the rack based on a value of the signal acquired by the signal acquisition unit;

a memory unit that stores the mounting position information generated by the control unit; and a communication unit that communicates with an outside area; and the system further comprises:

a management device that is communicably connected to the mounted device, wherein the communication unit transmits the mounting position information and identification information of the mounted device stored in the memory unit to the management device.

2. The rack mounting position management system according to claim 1, wherein the signal output unit is a barcode that displays a signal having a different value for each of the units of the rack, and the signal acquisition unit is a barcode reader that reads the signal displayed on the barcode.

3. A rack mounting position management method for a rack mounting position management system, the rack mounting position management system comprising:

a rack having a plurality of units; and a mounted device mounted in the rack, wherein the rack comprises, for each of the units, a signal output unit that outputs a signal having a different value for each of the units of the rack, the mounted device comprises:

a signal acquisition unit that acquires the signal output from the signal output unit; and a communication unit that communicates with an outside area; and the system further comprises:

a management device that is communicably connected to the mounted device; and the mounted device executes:

generation processing for generating, by using a program, a mounting position information indicating a mounting position of the mounted device in the rack based on a value of the signal acquired by the signal acquisition unit;

storage processing for causing a memory unit to store the mounting position information generated in the generation processing; and processing for causing the communication unit to transmit the mounting position information and identification information of the mounted device stored in the memory unit to the management device.

4. The rack mounting position management method according to claim 3, wherein the signal output unit is a barcode that displays a signal having a different value for each of the units of the rack, and the signal acquisition unit is a barcode reader that reads the signal displayed on the barcode.

* * * * *